(12) United States Patent
Braun et al.

(10) Patent No.: US 7,505,273 B2
(45) Date of Patent: Mar. 17, 2009

(54) COOLING BODY AND RECTIFIER MODULE FOR AN ELECTRICAL MACHINE

(75) Inventors: Horst Braun, Stuttgart (DE); Holger Scholzen, Stutttgart (DE); Hardy Haegele, Bruchsal (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/494,381

(22) PCT Filed: May 2, 2003

(86) PCT No.: PCT/DE03/01410

§ 371 (c)(1),
(2), (4) Date: May 3, 2004

(87) PCT Pub. No.: WO2004/017495

PCT Pub. Date: Feb. 26, 2004

(65) Prior Publication Data

US 2005/0013118 A1    Jan. 20, 2005

(30) Foreign Application Priority Data

Jul. 16, 2002    (DE) .............................. 102 32 051

(51) Int. Cl.
*H05K 7/20* (2006.01)
*H02K 1/32* (2006.01)
*H02K 3/24* (2006.01)

(52) U.S. Cl. .................... 361/709; 361/697; 361/703; 361/710; 310/64

(58) Field of Classification Search ................ 361/704, 361/703, 697, 709, 710; 310/68 D, 64, 60 A, 310/52

See application file for complete search history.

(56) References Cited

U.S. PATENT DOCUMENTS

| 3,196,317 | A | | 7/1965 | Potter et al. | |
|---|---|---|---|---|---|
| 3,198,972 | A | | 8/1965 | Larson | |
| 4,103,193 | A | * | 7/1978 | Ito | 310/68 D |
| 4,329,603 | A | * | 5/1982 | Ballard | 310/61 |
| 4,701,828 | A | * | 10/1987 | Weiner | 361/692 |
| 4,952,829 | A | * | 8/1990 | Armbruster et al. | 310/68 D |
| 5,043,614 | A | * | 8/1991 | Yockey | 310/68 D |
| 5,424,594 | A | * | 6/1995 | Saito et al. | 310/68 D |
| 5,652,471 | A | * | 7/1997 | Mayer et al. | 310/68 D |

(Continued)

FOREIGN PATENT DOCUMENTS

EP    0 262 907    4/1988

(Continued)

OTHER PUBLICATIONS

Title: Electric Machine, Preferably a Three-Phase Generator with Rectifier Unit, Pfluger et al., PCT No. PCT/DE98/00003, PCT Pub No. WO 98/36486, Aug. 20, 1998.*

*Primary Examiner*—Anatoly Vortman
(74) *Attorney, Agent, or Firm*—Michael J. Striker

(57) ABSTRACT

A heat sink, in particular for a rectifier unit of an electrical machine has at least one diode opening, and disposed around the at least one diode opening at least partially ring-shaped cooling air openings and at least one mass-increasing raised area, wherein the mass-increasing raised area extends between two of the cooling air openings associated with the diode opening.

19 Claims, 3 Drawing Sheets

U.S. PATENT DOCUMENTS

| | | | |
|---|---|---|---|
| 5,659,212 A * | 8/1997 | DePetris | 310/68 D |
| 5,866,963 A * | 2/1999 | Weiner et al. | 310/68 D |
| 6,205,024 B1 * | 3/2001 | Shih et al. | 361/704 |
| 6,285,100 B1 * | 9/2001 | Pflueger et al. | 310/68 D |
| 6,285,552 B1 * | 9/2001 | Adachi | 361/705 |
| 6,307,289 B1 * | 10/2001 | Skala | 310/68 D |
| 6,525,438 B1 * | 2/2003 | Asao | 310/68 D |
| 6,580,187 B2 * | 6/2003 | Bradfield | 310/64 |
| 6,661,662 B2 * | 12/2003 | DeNardis | 361/709 |
| 6,707,691 B2 * | 3/2004 | Bradfield | 363/145 |
| 6,731,030 B2 * | 5/2004 | Keidar et al. | 310/68 D |
| 6,740,995 B2 * | 5/2004 | Oohashi et al. | 310/68 D |
| 2001/0010436 A1 * | 8/2001 | Ballard et al. | 310/68 D |
| 2002/0005698 A1 * | 1/2002 | Asao | 318/140 |
| 2002/0047359 A1 * | 4/2002 | Seo | 310/68 D |
| 2002/0079757 A1 * | 6/2002 | Bradfield | 310/68 D |
| 2002/0114177 A1 * | 8/2002 | DeNardis | 363/141 |
| 2002/0136041 A1 * | 9/2002 | DeNardis | 363/144 |
| 2003/0042808 A1 * | 3/2003 | Keidar et al. | 310/68 D |
| 2003/0070798 A1 * | 4/2003 | Shih | 165/185 |
| 2003/0141042 A1 * | 7/2003 | Bradfield et al. | 165/80.3 |
| 2003/0198068 A1 * | 10/2003 | Bradfield | 363/145 |

FOREIGN PATENT DOCUMENTS

| | | |
|---|---|---|
| EP | 0 262 907 A1 | 4/1988 |
| EP | 0 388 953 | 9/1990 |
| EP | 0 329 722 B1 | 4/1992 |
| EP | 0 969 583 | 1/2000 |
| GB | 1 317 266 | 5/1973 |
| GB | 2 057 763 A | 4/1981 |
| GB | 2 107 130 | 4/1983 |
| JP | 2001128427 A * | 5/2001 |

* cited by examiner

COOLING BODY AND RECTIFIER MODULE FOR AN ELECTRICAL MACHINE

CROSS-REFERENCE TO A RELATED APPLICATION

The invention described and claimed hereinbelow is also described in German Patent Application DE 102 32 051.9 filed on Jul. 16, 2002. This German Patent Application, whose subject matter is incorporated here by reference, provides the basis for a claim of priority of invention under 35 U.S.C. 119(a)-(d).

BACKGROUND OF THE INVENTION

The present invention relates to a heat sink and a rectifier unit for an electrical machine.

EP 0329722 B1 has disclosed a heat sink and rectifier for an electrical machine currently on the market. Of the units of these generators sold, at least part are equipped with rectifiers whose heat sinks, in particular positive heat sinks, have cooling air openings arranged irregularly around the plus diodes. In order to continue to maintain an acceptable temperature level of the rectifier as output increases, i.e. with increased current output of the generator and an increase in the need for heat removal, it is necessary to improve the cooling of the diodes.

SUMMARY OF THE INVENTION

Accordingly, it is an object of the present invention to provide a heat sink and an rectifier for an electrical machine which is a further improvement of the existing devices.

In keeping with these objects and with others which will become apparent hereinafter, in a heat sink, in particular for a rectifier unit of an electrical machine, comprising at least one diode opening; and disposed around said at least one diode opening at least partially ring-shaped cooling air openings and at least one mass-increasing raised area, wherein said mass-increasing raised area extends between two of said cooling air openings associated with said diode opening.

Advantageous modifications of the heat sink according to the main claim are possible by means of the steps taken in the dependent claims. In the second, further improved embodiment, the deviation is maximally −35%, thus further increasing the flow of heat and therefore further improving the cooling action.

According to another embodiment, the radius-dependent circumference section of the heat sink and its deviation from the normal section lies in the range from $1.3=r/rD=2.0$. Thanks to cooling air openings provided, this embodiment permits a flow through the heat sink and therefore achieves additional heat removal and reduced flow resistance. An additional heat sink disposed behind it therefore enjoys a greater circulation of cooling air around it and can in turn give off more thermal energy.

If the cooling air openings are arranged in at least a partial ring form around the at least one diode opening or diode, then the arrangement of the cooling air openings corresponds to the ring-shaped or ray-shaped heat conduction characteristic of diodes. This results in a further improvement in the heat removal.

If the heat sink has at least two cooling air openings that are disposed at least essentially uniformly around a diode opening or diode, then this results in a uniform heat conduction characteristic and therefore a uniform heat removal from the diode and heating of the heat sink, which result in an effective cooling action.

If the heat sink is at least partially the shape of an annular segment and at least one cooling air opening is placed between the diode opening or diode and a central opening of the heat sink, then this results in a reduced flow resistance for the cooling air flow into the inside of the generator and therefore a greater air flow rate due to a less sharply curved flow around the edge of the central opening.

If the heat sink, which is at least partially the shape of an annular segment, has at least one cooling air opening between the diode opening or diode and an outer radial edge, then the flow resistance for the flow into the inside of the generator is reduced at this outer edge as well; this also increases the air flow rate thanks to a less sharply curved flow.

If the cooling air openings are oblong in shape, with a longitudinal axis oriented toward the central opening, then this further reduces the flow resistance.

The longitudinal axis of the oblong cooling air openings is preferably oriented essentially radial to the diode opening or diode.

If the diode openings or diodes and the cooling air openings surrounding them are disposed relatively close to one another, then relatively large heat flows meet at these points. Since these heat flows would lead to an increase in the temperature level of the heat sink in the absence of additional steps, a raised area is provided, extending between each pair of cooling air openings associated with a diode opening or diode. This raised area results in an increase in mass as part of an increase in surface area and consequently results in an improved heat removal at this critical location. In order to achieve the lowest possible flow resistance of the raised area, the raised area extends in the direction of a central axis of the heat sink so that this raised area extends essentially or fully in the radial direction. In addition, the cooling air openings can be situated very close to adjacent raised areas in order to convey the air along these raised areas and therefore to deliberately produce an airflow that flows past the raised areas.

A further improved cooling action of the raised area is achieved by having the raised area extend into the central opening of the heat sink.

A further improved cooling action of the heat sink is achieved by having an additional radial raised area extend between two cooling air openings disposed between the diode boundary surface and the outer radial edge.

For a uniform and therefore further optimized cooling action, at least two cooling air openings are disposed essentially uniformly around a diode boundary surface.

In order to further improve the cooling action, a raised area is provided between two diode boundary surfaces and is ideally disposed between two cooling air openings.

According to a collateral claim, a rectifier unit is provided with at least one heat sink according to one of the preceding claims.

BRIEF DESCRIPTION OF THE DRAWINGS

The drawings show exemplary embodiments of a heat sink according to the invention and a rectifier unit with a heat sink according to the invention.

DESCRIPTION OF THE PREFERRED EMBODIMENTS

Figure 1:
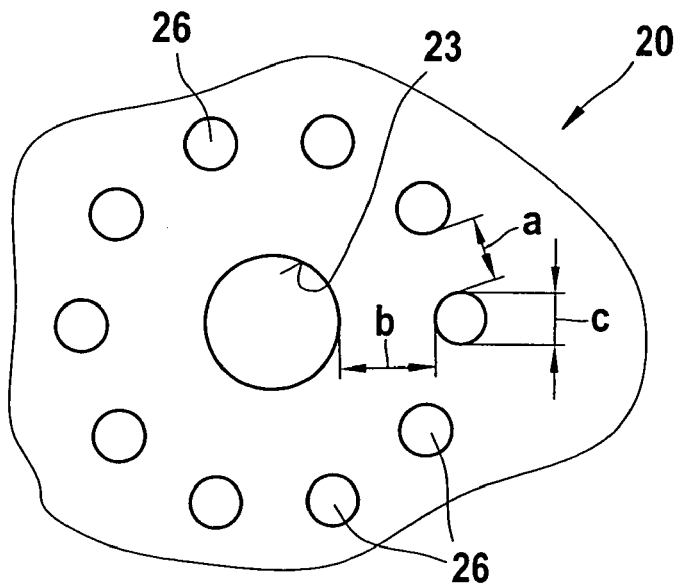
FIG. 1 is a schematic representation of a perforated heat sink.

FIG. 1 shows a detail of a heat sink 20. The heat sink 20 has a number of openings, including at least one diode opening 23, which constitutes a diode boundary surface and is intended for the insertion of a diode. At least two cooling air openings 26 are arranged around this one diode opening 23; in the example, ten cooling air openings 26 are arranged around the one diode opening 23. In the exemplary embodiment according to FIG. 1, two cooling air openings 26 are spaced apart from each other by a distance a and are spaced apart from an edge of the diode opening 23 or diode by a distance b. As is clear from FIG. 1, the cooling air openings 26 are arranged in a ring around the at least one diode opening 23. This arrangement is an exemplary embodiment to meet the requirement that the cooling air openings 26 be disposed in at least a partial ring form around the diode opening 23.

Figure 2:
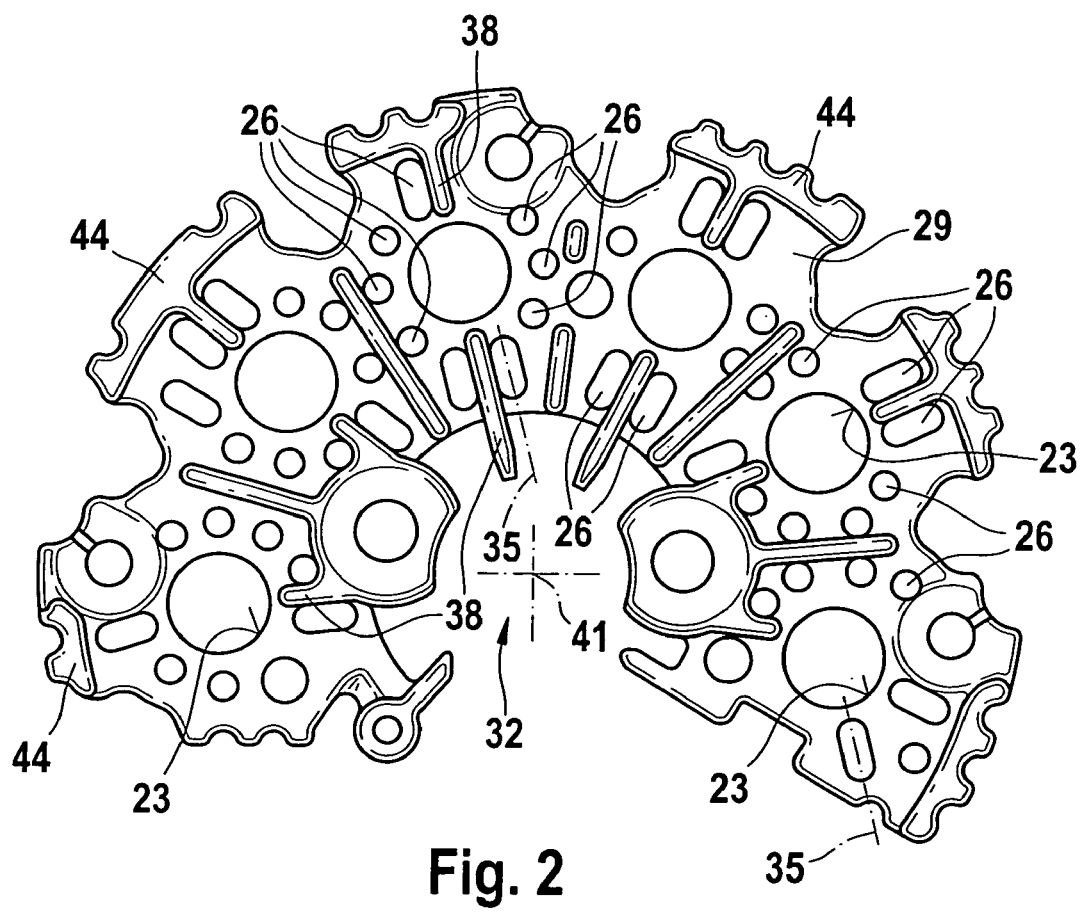
FIG. 2 is a top view of a heat sink.

FIG. 2 is a top view of an entire heat sink 20, which is provided in particular for rectifier units of rotary current generators for motor vehicles. To start with, the heat sink 20 is comprised of a flat, i.e. essentially planar, base body 29 that has six diode openings 23 let into it in this exemplary embodiment. Usually, rectifier diodes are press-fitted into these essentially uniformly spaced diode openings 23. During rectifier operation, these rectifier diodes generate a dissipated energy that must be removed via the base body 29 in order to prevent the diodes from overheating. The cooling action of a perforated base body 29 is markedly better than that of an unperforated base body 29, which is why the above-mentioned cooling air openings 26 are provided in the base body 29. The heat sink 20 is at least partially the shape of an annular segment and has a central opening 32 in the middle of its ring. If the rectifier with the heat sink 20 is mounted onto the electrical machine, then a shaft end of a rotor, not shown, protrudes through this central opening 32. At least one cooling air opening 26, which is oblong in form and has a longitudinal axis 35, is provided between a diode opening 23 and the central opening 32. The longitudinal axis 35 is oriented toward the central opening 32. The cooling action is particularly advantageous if two of these oblong cooling air openings 26 are disposed next to each other between the diode opening 23 and the central opening 32. Two adjacent cooling air openings 26 basically function as a throttle so that at first, two adjacent cooling air openings 26 hinder the thermal transport in a direction oriented away from a diode. For this reason, a raised area 38 is provided, which extends between two cooling air openings 26 disposed between a diode opening 23 and the central opening 32. Ideally, the raised area 38 extends in the direction of a central axis 41 or in a radially inward direction. This central axis 41, depicted as a cross in FIG. 2 and essentially perpendicular to the base body 29, coincides with a rotation axis of a rotor, not shown, and indicates a center point of a for example circular contour of the heat sink 20. In addition, at least one of the raised areas 38 extends into the central opening 32. Alternatively, instead of an oblong cooling air opening 26, it is naturally also possible for there to be a simple cooling air opening 26 or a number of cooling air openings 26 arranged in sequence, which are disposed in a preferably radially-oriented longitudinal direction.

In addition, between a diode opening 23 and an outer radial edge 44, the essentially planar base body 29 is provided with at least one cooling air opening 26 that has an oblong form with a longitudinal axis 35. The longitudinal axis 35 here is also oriented toward the central opening 32. Alternatively, instead of an oblong cooling air opening 26, it is naturally also possible here to provide a simple cooling air opening 26 or a number of cooling air openings 26 arranged in sequence, which are disposed in a longitudinal direction preferably oriented radial to the diode opening 23. In another embodiment of the oblong diode openings 23, the longitudinal axis 35 is aligned radially or essentially radially in relation to the diode opening 23. In order to improve the cooling action of the outer radial edge, this edge can be ribbed or corrugated on a surface oriented toward the radial outside.

Analogous to the oblong cooling air openings 26 between the diode opening 23 and the central opening 32, a raised area 38 is also provided between two adjacent oblong diode openings 23, between the outer radial edge 44 and a diode opening 23.

On the whole, the at least two cooling air openings 26 are supposed to be arranged essentially uniformly around a diode opening 23. If, for space reasons, two adjacent diodes are placed relatively close to each other and if at the same time, as is generally supposed to be the case, cooling air openings 26 are arranged around the diodes, then there is the danger that due to the very close proximity of the through openings 26 of two different diodes, a heat buildup will generate between the diodes. A heat buildup of this kind results in only a limited heat removal between the diodes and as a result, the temperature level increases in the center between two diodes. In order to remedy this problem, a raised area 38 extending from the base body 29 is provided between two diode openings 23. In a particularly preferable embodiment, the raised area 38 is disposed between at least two cooling air openings 26 of two adjacent diodes.

Figure 3:
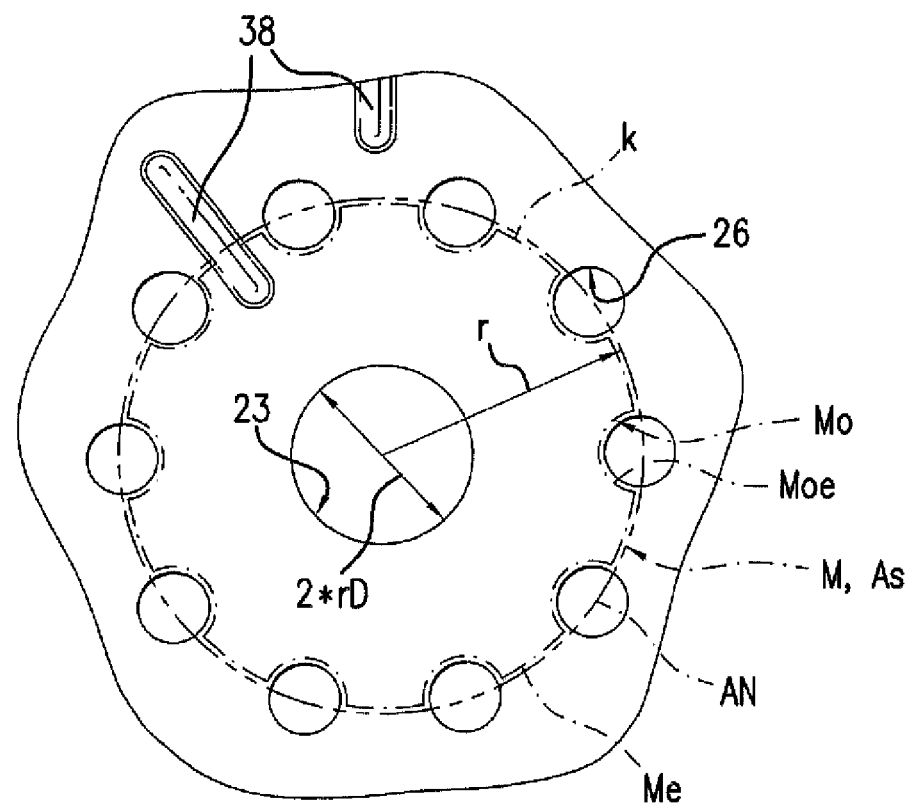
FIG. 3 is another schematic representation of a perforated heat sink.

If FIG. 3 is considered to be the device already known from FIG. 1, in which a raised area 38 is also provided around the diode or diode opening 23, then an imaginary concentric circle can be traced around a diode opening 23. Such a circle k is drawn in FIG. 3. If the circle k intersects cooling air openings 26 as shown, then at the depth of the heat sink 20, on the one hand, a so-called circumference section M is produced, which in this instance is interrupted by the cooling air openings 26. The entire circumference section M in this instance is comprised of ten separate circumference section surfaces Me. Separate circumference surfaces Moe are also produced, which are situated inside the cooling air openings 26. A number of these separate circumference surfaces Moe constitute an entire circumference surface Mo. The heat flow cross section in the surface direction of the heat sink 20 is based on the circumference section M, which is dependent on the radius r.

Figure 4:
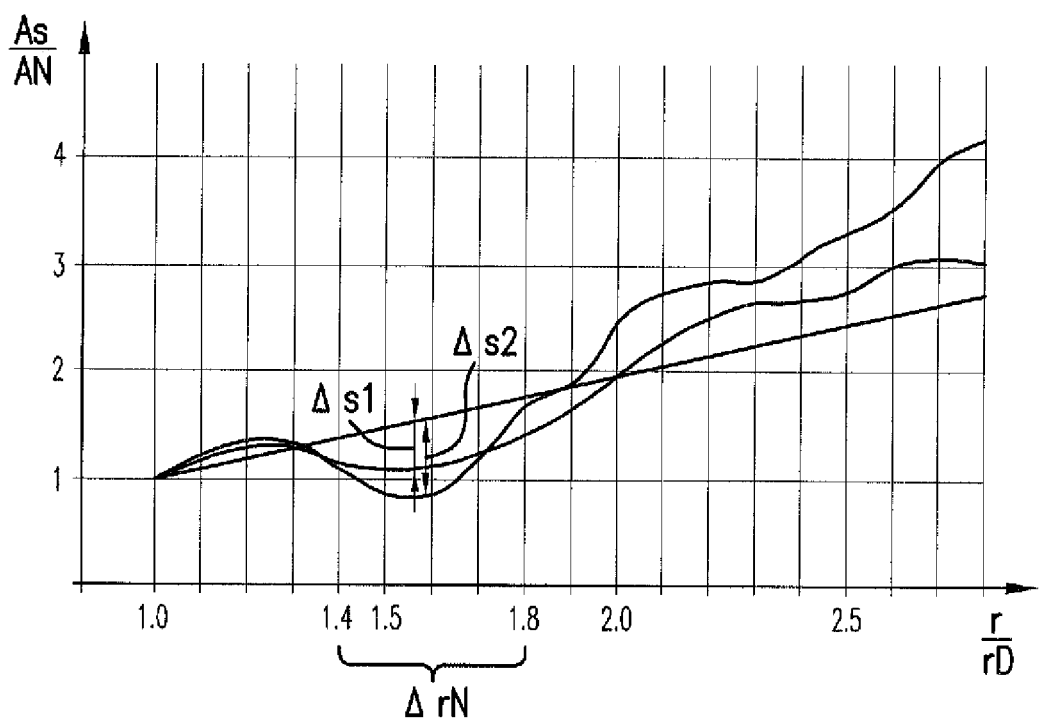
FIG. 4 is a graph of a relationship between a heat flow cross section and a radius.

The circumference section M is referred to here as area As. This radius-dependent area As can be normalized in relation to the theoretical cylindrical circumference section of an unperforated, unribbed heat sink 20, the area AN. This reference circumference section corresponds to a theoretical cylindrical circumference area around the diode opening 23, which has the radius r. The circumference section or the area As and the reference circumference section AN are based initially on the assumption of equal plate thicknesses for holding the diodes. Raised areas, ribs, etc. directly on the diode are not considered in the determination of the plate thickness. If r is set equal to radius rD of the diode opening 23 or of the soldered-in diode, then this yields the value 1 for the two areas to be compared if As is being set in relation to AN. The radius r can also be normalized by setting the radius r in relation to the radius rD of the diode opening 23. If a radius-dependent circumference section M is set in relation to a radius-dependent normal section AN, then a normalized graph, FIG. 4, can be generated. According to FIG. 4, a radius-dependent circumference section M of the heat sink 20 around a diode opening 23 deviates from a radius-dependent normal section by maximally −52%. This deviation is labeled with the symbol Δs2 in FIG. 4. According to an improved embodiment, there is a deviation (Δsi) of maximally −35%. The permissible deviation lies in the range between 1.4=r/rD=1.8.

The term "raised area" is not limited to an oblong form—for example that of a cooling fin. It is also understood to mean an essentially cylindrical or even conical form; it is also possible to fulfill the same function with an alternating sequence of separate, essentially cylindrical or even conical raised cooling areas.

The term "diode boundary surface" is understood on the one hand to be an essentially cylindrical circumference surface of a diode opening comprised of the diode opening 23. On the other hand, the term is also understood to mean the actual soldered connection surface between the diode and the heat sink when diodes are soldered to the heat sink. An important property of the diode boundary surface is the fact that this is the area in which the heat transmission from the diode to the heat sink occurs.

Figure 5:
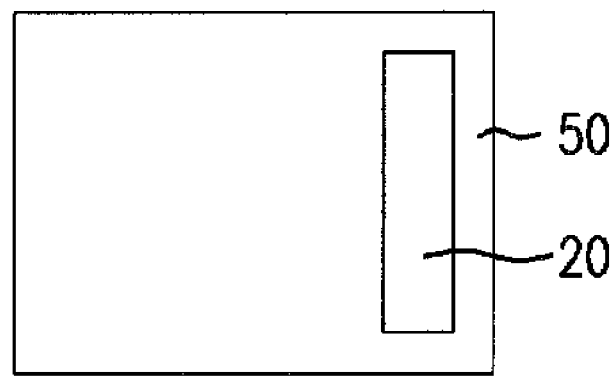
FIG. 5 is a top view of a heat sink according to the prior art.

Finally, a rectifier unit 50 is provided, which has a heat sink 20 according to one of the above-described examples, FIG. 5. For example, the rectifier unit 50 can be equipped with two separate heat sinks 20 for installation onto an end plate of a generator or can also be equipped with one heat sink 20 that is embodied, for example, as a positive heat sink and with another heat sink 20 that is embodied, for example, as a negative heat sink 20, this additional heat sink 20 also having the function of an end plate, i.e. constituting a part of the generator housing.

The invention claimed is:

1. A heat sink, in particular for a rectifier unit of an electrical machine, comprising at least one diode opening; and disposed around said at least one diode opening at least partially ring-shaped cooling air openings and at least one mass-increasing raised area, wherein said mass-increasing raised area extends between two of said cooling air openings associated with said diode opening; a diode boundary surface which corresponds to a circumference of said diode opening; and a radius-dependent circumference section of the heat sink concentric to a diode boundary surface which deviates from a radius-dependent normal section by maximally 52%, wherein the normal section is a theoretical cylindrical circumference section of the heat sink that is unholed and unribbed.

2. A heat sink as defined in claim 1, wherein a deviation is maximally 35%.

3. A heat sink as defined in claim 1, wherein a deviation is in a range from 1.4≦r/rD≦1.8, wherein r is a radius, and rD is a radius of said diode opening.

4. A heat sink, in particular for a rectifier unit of an electrical machine, comprising at least one diode opening; and disposed around said at least one diode opening at least partially ring-shaped cooling air openings and at least one mass-increasing raised area, wherein said mass-increasing raised area extends between two of said cooling air openings associated with said diode opening, wherein said raised area extends into a central opening.

5. A heat sink, in particular for a rectifier unit of an electrical machine, comprising at least two diode openings located adjacent to one another; at least two cooling air openings located between said two diode openings in a direct line and completely confined between said two diode openings; a straight raised area located between said at least two cooling air openings and formed as a cooling rib, wherein said cooling air openings are smaller than said two diode openings.

6. A heat sink as defined in claim 5; and further comprising a diode boundary surface which corresponds to a circumference of said diode opening; and a radius-dependent circumference section of the heat sink concentric to a diode boundary surface which deviates from a radius-dependent normal section by maximally 52%, wherein the normal section is a theoretical cylindrical circumference section of the heat sink that is unholed and unribbed.

7. A heat sink as defined in claim 6, wherein a deviation is maximally 35%.

8. A heat sink as defined in claim 6, wherein a deviation is in a range from 1.4≦r/rD≦1.8, wherein r is a radius, and rD is a radius of said diode opening.

9. A heat sink as defined in claim 5, wherein said two cooling air openings are arranged substantially uniformly around a diode boundary surface.

10. A heat sink as defined in claim 5, wherein the heat sink is at least partially shaped as an annular segment, at least one of said cooling air openings being disposed between a diode boundary surface and a central opening.

11. A heat sink as defined in claim 5, wherein the heat sink is at least partially shaped as an annular segment, at least one of said cooling air openings being disposed between an outer edge of the heat sink and a diode boundary surface.

12. A rectifier unit, comprising at least one heat sink, said heat sink including at least two diode openings located adjacent to one another, at least two cooling air openings located between said two diode openings in a direct line and completely confined between said two diode openings, a straight raised area located between said at least two cooling air openings and formed as a rib, wherein said cooling air openings are smaller than said two diode openings.

13. A heat sink, in particular for a rectifier unit of an electrical machine, comprising at least one diode opening; cooling air openings disposed around said at least one diode opening and arranged so that distances between said two cooling air openings to said diode opening are identical; a raised area located between said two cooling air openings and formed as a cooling rib, wherein said cooling rib extends in a rib longitudinal direction, which in a direction of its greatest length of its cross section extends parallel to a plane base body of the heat sink, wherein said raised area formed as a cooling rib extends with its rib longitudinal direction radially to said diode openings and radially in a direction to a central axis of said base body.

14. A heat sink as defined in claim 13; and further comprising a diode boundary surface which corresponds to a circumference of said diode opening; and a radius-dependent circumference section of the heat sink concentric to a diode boundary surface which deviates from a radius-dependent normal section by maximally 52%, wherein the normal section is a theoretical cylindrical circumference section of the heat sink that is unholed and unribbed.

15. A heat sink as defined in claim 14, wherein a deviation is maximally 35%.

16. A heat sink as defined in claim 14, wherein a deviation is in a range from 1.4≦r/rD≦1.8, wherein r is a radius, and rD is a radius of said diode opening.

17. A heat sink as defined in claim 13, wherein said two cooling air openings are arranged substantially uniformly around a diode boundary surface.

18. A heat sink as defined in claim 13, wherein the heat sink is at least partially shaped as an annular segment, at least one of said cooling air openings being disposed between a diode boundary surface and a central opening.

19. A heat sink as defined in claim 13, wherein the heat sink is at least partially shaped as an annular segment, at least one of said cooling air openings being disposed between an outer edge of the heat sink and a diode boundary surface.

* * * * *